United States Patent [19]

Hotta et al.

[11] 4,409,725
[45] Oct. 18, 1983

[54] METHOD OF MAKING SEMICONDUCTOR INTEGRATED CIRCUIT

[75] Inventors: Tadahiko Hotta; Terumoto Nonaka, both of Hamamatsu, Japan

[73] Assignee: Nippon Gakki Seizo Kabushiki Kaisha, Hamamatsu, Japan

[21] Appl. No.: 309,428

[22] Filed: Oct. 7, 1981

[30] Foreign Application Priority Data

Oct. 16, 1980 [JP] Japan ............................... 55-144617
Oct. 16, 1980 [JP] Japan ............................... 55-144618

[51] Int. Cl.³ .................. H01L 21/22; H01L 21/306; H01L 29/76
[52] U.S. Cl. ................................. 29/571; 29/576 R; 29/577 R
[58] Field of Search ............... 29/571, 576 R, 576 W, 29/577 R, 577 C, 578, 590; 148/1.5, 186; 357/22, 41, 42, 43

[56] References Cited

U.S. PATENT DOCUMENTS

4,046,605 9/1977 Nelson et al. ................. 29/577 C X
4,049,476 9/1977 Horie ............................... 357/22 X
4,325,180 4/1982 Curran ............................ 357/22 X

FOREIGN PATENT DOCUMENTS

WO81/00489 2/1981 PCT Int'l Appl. ............... 357/15 P

*Primary Examiner*—M. J. Andrews
*Assistant Examiner*—David A. Hey
*Attorney, Agent, or Firm*—Spensley, Horn, Jubas & Lubitz

[57] ABSTRACT

A method of making a semiconductor integrated circuit on a semiconductor substrate containing thereon an SIT and an IG(MOS) FET or an SIT and C-MOS FETs, comprises a series of steps of making these functional semiconductor devices many of which steps are rendered to be common to the SIT and the FET. The gate region of said IG(MOS) FET is formed as a semiconductor gate layer which typically is made of polycrystalline silicon, and an active semiconductor area of said IG(MOS) FET is formed by using this semiconductor gate layer as the mask therefor.

5 Claims, 11 Drawing Figures

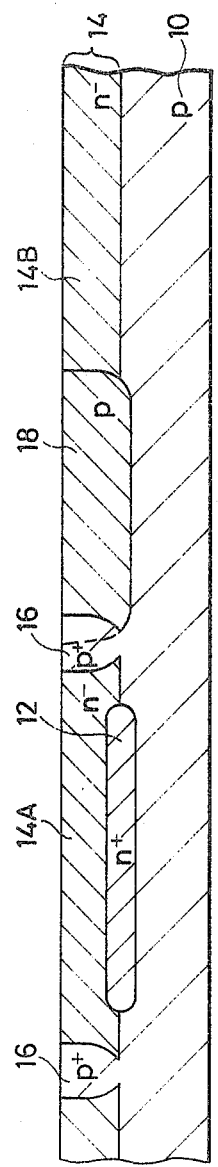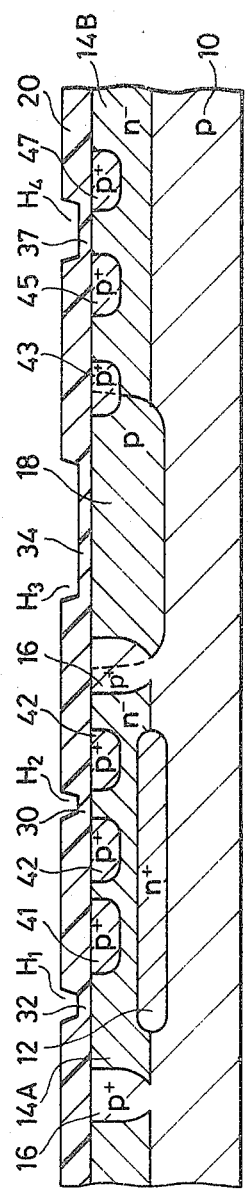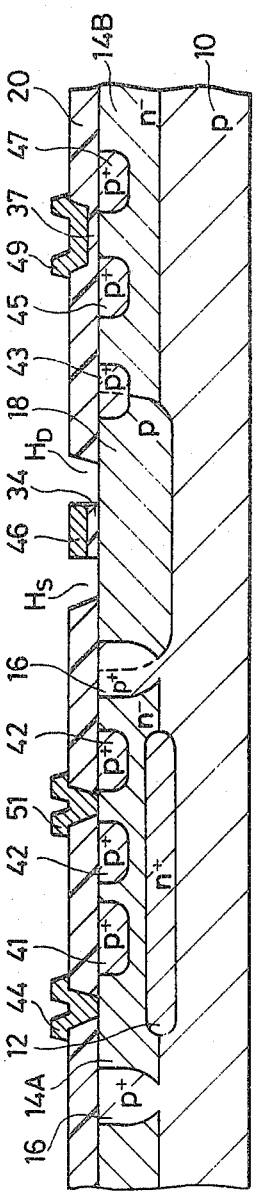

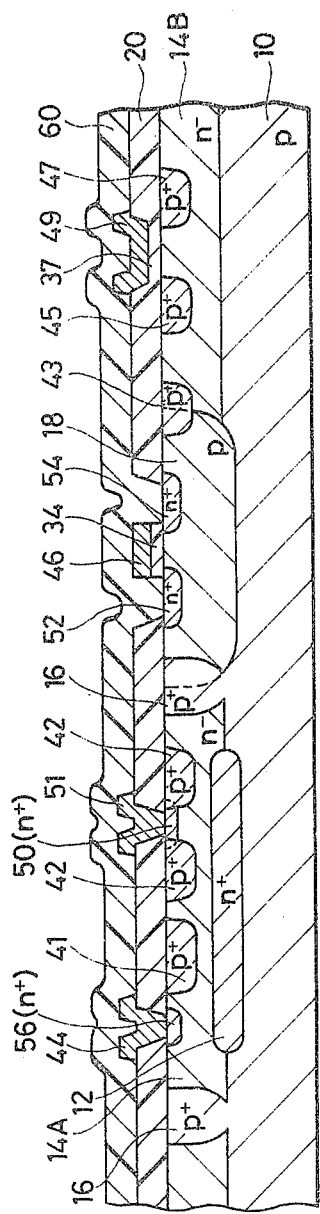
FIG. 10
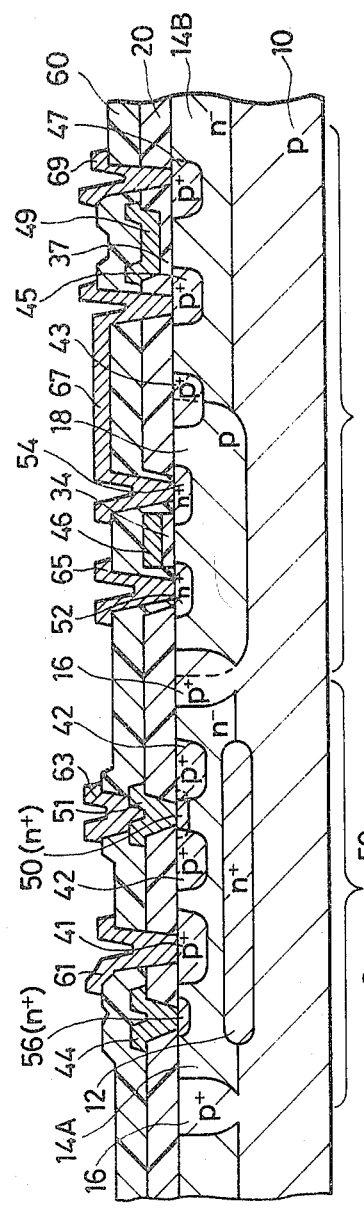
FIG. 11
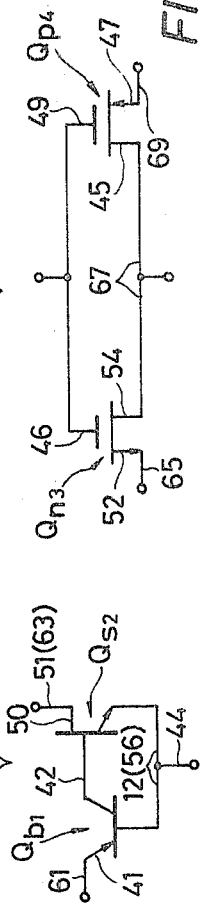

METHOD OF MAKING SEMICONDUCTOR INTEGRATED CIRCUIT

BACKGROUND OF THE INVENTION (a) Field of the invention

The present invention relates to a method of making a semiconductor integrated circuit, and more particularly it pertains to a semiconductor integrated circuit comprising a static induction transistor (hereinafter referred to briefly as SIT) and an insulated-gate type field effect transistor (hereinafter referred to as IG-FET).

(b) Description of the prior art

Semiconductor integrated circuits which are called generally IC usually employ, as an active semiconductor device, a bipolar transistor or an IG-FET. With the recent development of SITs having new characteristics, attention is now being paid to an IC having, incorporated therein, either a junction type SIT or an IG(MOS) SIT so as to positively utilize the excellent characteristics of such devices. ICs are now used in electronic apparatuses in various technical fields, and there are formed various types of circuit arrangements so as to meet the specific use of the respective electronic apparatuses. In such integrated circuits, the points to which a keen interest is being placed and which are being studied at present are the following two, i.e. one of which concerns the improvement of packing density and the other concerns the improvement of operation speed. The former represents the efforts to pack or integrate as many semiconductor devices as possible per unit area, and the importance of this former point increases further as the scale of integration increases up to what is generally called LSI (Large Scale Integration) and further to VLSI (Very Large Scale Integration). This packing density is a factor which, when an IC is used as a memory device, governs the feasibility of the largeness in capacity of a memory device. The latter, i.e. the operation speed, in the other hand, is related to the operationability at higher speed, and in case an IC is used as a logic circuit, the operation speed of the semiconductor device will become the factor for the control of the velocity of the logic operation.

As discussed above, in an IC, the materialization of a higher packing density and a higher operation speed constitutes a very important task, and in particular, in a logic circuit including a memory, these factors will assume the most critical tasks requiring attainment. In the past, however, there has hardly been accomplished such IC as is capable of satisfying these two features at the same time.

Generally speaking, when comparison is made between a bipolar transistor type IC and a MOS FET type IC, it has been accepted widely that the former, i.e. the bipolar transistor type IC, is superior in the speed of operation, and that, with respect to such aspects as power dissipation and packing density (accordingly, for example, a large capacity memory), MOS-IC is superior. However, since "SIT" has come to fore, new circuit arrangement utilizing the unique characteristic of SIT has become possible. Accordingly, it has since then become difficult to determine the superiority of ICs only through the comparison of the above-mentioned two types of ICs, and there has arisen the necessity for a review of this matter. Based on the foregoing consideration, a brief comparison will hereunder be made between a MOS-FET type IC and an SIT type IC.

An IG(MOS) FET type IC as can be represented typically by, for example, MOS-LSI can have a high packing density as stated above, but owing to its high dependency on its layout, its operation speed is not necessarily high. On the other hand, an IC which is represented typically by SITL (SIT logic) allows the display of the unique characteristic of SIT, and even when compared with a bipolar transistor type IC, its operation speed is much higher, and in addition, the packing density can be made high to a certain extent. However, when this SITL is viewed as a logic circuit, there have been the instances wherein the packing density of the SITL is poor as compared with an IG(MOS) FET type IC having a dynamic logic arrangement, because the logic arrangement of SITL is static in nature.

SUMMARY OF THE INVENTION

It is, therefore, the object of the present invention to provide a method of obtaining an IC having a junction type SIT and an IG-FET incorporated therein through a minimized number of manufacturing steps while adopting such method and structure as will allow the positive utilization of the features of the respective constituent junction type SIT and IG-FET and also will enable the integration of these semiconductor devices to be accomplished on a same semiconductor substrate in substantially common steps.

BREIF DESCRIPTION OF THE DRAWINGS

FIGS. 7 through 11 are sectional views of a semiconductor substrate, showing the respective manufacturing steps of obtaining semiconductor integrated circuit for use as a logic circuit by integrating an SIT and a complementary IG(MOS) FET having a conductivity type opposite to that of said SIT, as a second embodiment of the present invention.

DETAILED DESCRIPTION OF THE PREFERRED EMBODIMENTS

The present invention will hereunder be described in further detail with respect to some preferred embodiments by referring to the accompanying drawings.

FIRST EMBODIMENT

FIGS. 1 through 6 show an example of the manufacturing steps of integrating, on a same semiconductor substrate, a junction type SIT and an IG FET (MOS FET) of the same conductivity type with the junction SIT according the method of the present invention. Figures are shown in sequential order of the manufacturing steps and the following description will be made in correspondence with the respective figures.

Step (a)

Figure 1:
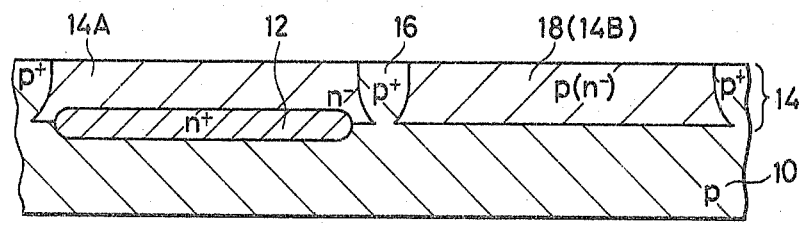
FIGS. 1 through 6 are sectional views of a semiconductor substrate, showing the respective steps of obtaining a semiconductor integrated circuit by integrating on the substrate an SIT and an IG(MOS) FET, as a first embodiment of the present invention.

In FIG. 1, a p type silicon having an impurity concentration of $10^{20}$–$10^{22}$ atoms/m$^3$ is used to serve as a semiconductor substrate 10. An n+ type buried semiconductor layer 12 having an impurity concentration of $10^{24}$ atoms/m$^3$ or greater is formed at a required site on surface of said substrate 10 by relying on, for example, a known selective diffusion technique. Thereafter, an n⁻ type semiconductor epitaxial layer 14 having a thickness in the range of 1 to 3 μm and an impurity concentration of $5\times10^{19}$–$5\times10^{22}$ atoms/m³ is grown on top of said n⁺ type buried layer 12 by relying on a known vapor epitaxial growth technique.

The n⁺ type buried layer 12 will serve in this embodiment as a drain region of a junction type SIT $Q_{s1}$ which is a vertical type construction so that it will not occupy a large area. The layer 12 may be a source region to form an upside-down vertical SIT. Then, a silicon oxide film is formed on the n⁻ type layer 14 by relying on an ordinary method such as thermal oxidation. Thereafter, there are formed windows selectively at predetermined sites of said silicon oxide film by relying on a known photolithographic technique. Through these windows is selectively diffused a p type impurity in order to form a p⁺ type semiconductor region 16 having an impurity concentration of $10^{25}$–$10^{27}$ atoms/m³ and intended for electric isolation so as to have a depth reaching the p type substrate 10. Owing to this p⁺ type isolation region 16, the n⁻ type layer 14 is isolated into a plurality of, which in this embodiment are two, island-like n⁻ type regions 14A and 14B.

Then, the conductivity type of the entire n⁻ type region 14B is converted to a p type to form a p type well region 18 having an impurity concentration of $5\times10^{20}$–$5\times10^{22}$ atoms/m³, usually $1\times10^{22}$ atoms/m³. This conversion of the n type of said region to the p type can be carried out by relying on the known selective diffusion of a p type impurity. To this end, this selective diffusion may be performed in the same step as for the p type impurity diffusion which is intended for the aforesaid electric isolation. Anyway, it is necessary to convert the conductivity type throughout the region which contacts the substrate 10. Another means of converting the conductivity type may rely on selective implantation of a p type impurity in the n⁻ type region 14B by relying on the known ion-implantation technique. In such instance, the process is designed so that, prior to the aforesaid isolation diffusion step, an ion-implantation is performed, and the implanted impurity is caused to redistribute during the thermal treatment which is given at the time of said isolation diffusion step, to convert the whole n⁻ type region 14B to a p type well region 18, whereby the entire process is simplified, and the steps are made common. The island-like region 14A is destined to become region wherein an n-channel junction type SIT $Q_{s1}$ is formed, whereas the p type well region 18 is the region wherein an n-channel IG(MOS) FET $Q_{n2}$ is formed. The specimen which is resulted from the above-mentioned step and from subsequent removal of oxide films will exhibit a sectional view as shown in FIG. 1.

Step (b)

Figure 2:
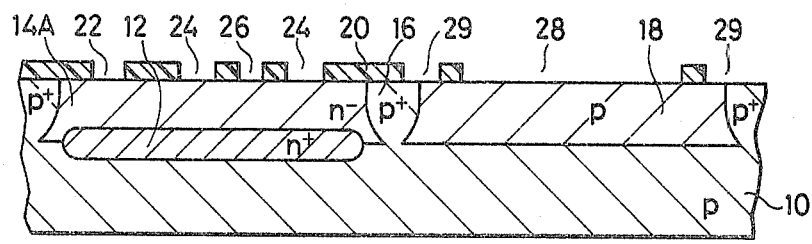

Next, the upper surface of the specimen shown in FIG. 1 is oxidized by relying on an ordinary oxidation process to form a silicon oxide film 20. Then, windows are formed selectively through this silicon oxide film 20 by relying on known photolithographic process. These windows comprise those for the island-like n⁻ type region 14A, and they include a window 22 intended for the formation of a drain ohmic contact for the SIT, a window 24 intended for the formation of a gate region for this SIT, and a window 26 intended for the formation of a source ohmic contact for the SIT, and also comprise those for the island-like p type well region 18 which include a window 28 intended for the formation of an IG(MOS) FET, and a window 29 for the formation of a channel stopper region. A sectional view of the specimen after the formation of these windows is shown in FIG. 2.

Step (c)

Figure 3:
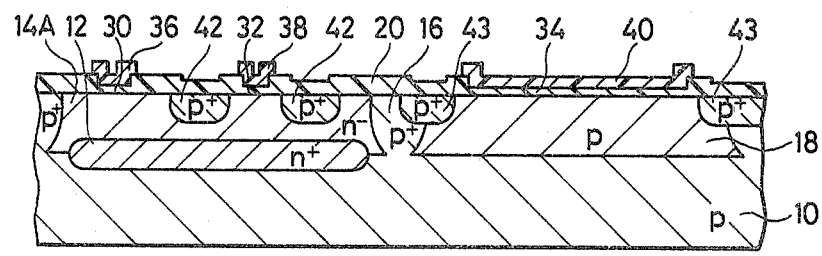

The resulting specimen is then subjected to oxidization for a short length of time by relying on the known oxidation process to thereby form a thin silicon oxide film for each of the windows 22, 24, 26, 28 and 29. Thereafter, by relying on the CVD (Chemical Vapor Deposition) method, a silicon nitride Si₃N₄ film is deposited on the entire surface of the thin silicon oxide film. Then, by relying on an ordinary photolithographic process, those silicon nitride films 36, 38 and 40 which have been deposited on those regions 30, 32 and 34 having their respective thin oxide films formed in the windows 22, 26 and 28 are selectively retained as shown in FIG. 3, while removing the other silicon nitride film portions. Thereafter, the thin silicon oxide films in the windows 24 and 29 are removed. In such instance, it should be understood that, because there are differences in the thickness of the silicon oxide films, their removal may not rely on the photolithographic technique. Then, through these windows is selectively diffused a p type impurity such as Boron into the island-like n⁻ type region 14A and into the p type well region 18, respectively, so that a p⁺ type gate region 42 having an impurity concentration of $5\times10^{24}$–$5\times10^{26}$ atoms/m³ and a p⁺ type channel stopper region 43 of the SIT $Q_{s1}$ are formed at the same time. It should be noted here that, owing to the thermal treatment conducted during this impurity diffusion process, an oxidation will progress concurrently. Therefore, the thickness of the silicon oxide film of the region which is covered with the silicon nitride film will not change, whereas the thickness of the silicon oxide films of the other regions will change, so that in each of the windows 24 and 29, there will be freshly formed thremally a film having a thickness greater than the thickness of that silicon oxide film which has been removed priorly. Concurrently therewith also, the thickness of the field silicon oxide film 20 will increase. A sectional view of the specimen after completion of the abovesaid step is shown in FIG. 3.

Step (d)

Figure 4:
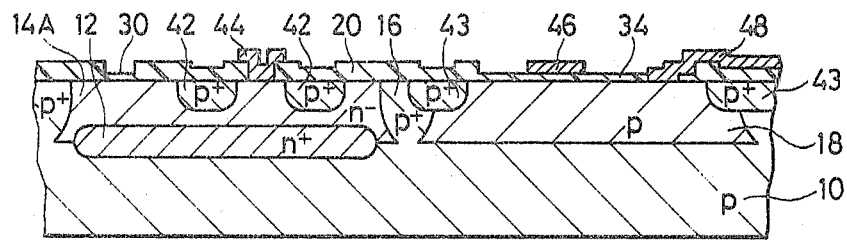
Figure 5:
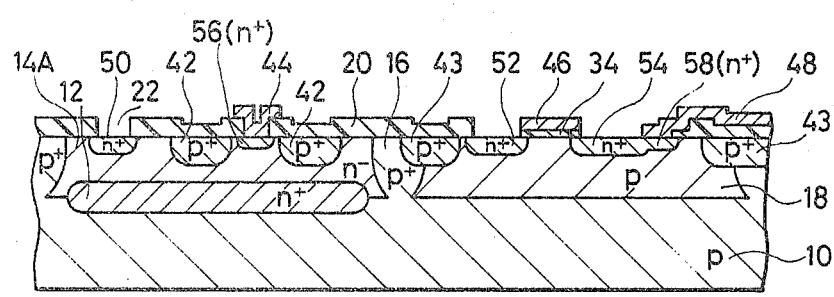

Thereafter, the silicon nitride films 36, 38 and 40 are removed. Then, the silicon oxide film 32 which is located in the window 26 and intended for the formation of a source ohmic contact, and a portion of the silicon oxide film 34 which is located in the window 28 and intended for the formation of an IG-FET are selectively removed by relying on the photolithographic process, and then a polycrystalline silicon film is deposited on the resulting surfaces of the abovesaid areas by relying on the CVD method, and once again the remainder portions are removed by photolithographic process to selectively retain polycrystalline silicon layers 44, 46 and 48. The polycrystalline silicon layer 44 is to serve as an ohmic contact electrode of the source region of the SIT $Q_{s1}$, and the polycrystalline silicon layer 46 is to serve as a gate electrode of the IG(MOS) FET $Q_{n2}$, and the polycrystalline silicon layer 48 is to serve as an ohmic contact electrode of a drain region os the IG(MOS) FET $Q_{n2}$. A sectional view of the specimen obtained in this step is shown in FIG. 4.

Step (e)

Then, by relying on the selective etching process using the polycrystalline silicon layers 44, 46 and 48 as masks, the silicon oxide film 30 located in the window 22 and intended for the formation of an ohmic contact electrode of the drain region is removed. Concurrently therewith, the silicon oxide film 34 located on both lateral sides of the polycrystalline silicon layer 46 is removed to form windows for the formation of the source region and the drain region of the IG(MOS) FET $Q_{n2}$. Such step can be possible because of the sufficient thickness of those silicon oxide films other than the thin silicon oxide films 30 and 34. And, by a selective diffusion of an n type impurity such as Phosphorus by using the silicon oxide film 20 and the polycrystalline silicon layer 46 as masks, there can be formed, in the islandlike region 14A, an n+ type drain lead-out region 50 of the SIT $Q_{s1}$ having an impurity concentration of $5 \times 10^{25}$–$1 \times 10^{27}$ atoms/m$^3$ at a site corresponding to the window 22. Concurrently therewith, there can be formed, in the well region 18, an n+ type source region 52 and an n+ type drain region 54 of the IG(MOS) FET $Q_{n2}$ in such manner as can be regarded as self-alignment relative to the polycrystalline silicon layer 46. Not only that, the impurity is simultaneously diffused into the polycrystalline silicon layers also. Accordingly, it is possible to sufficiently reduce the resistivity of the polycrystalline silicon layers 44, 46 and 48. Furthermore, not only those layers as mentioned above are rendered to low resistivity regions, but also owing to the diffusion of the n type impurity which has passed through the polycrystalline silicon layers 44 and 48, there are produced an n+ type source region 56 of the SIT $Q_{s1}$ and an n+ type drain lead-out region 58 of the IG(MOS) FET $Q_{n2}$. In this instance, these n+ type regions 56 and 58 are formed to be shallower than the depth of the n+ type regions 50, 52 and 54. It should be noted here that the drain lead-out region 50 and the source region 56 of the SIT $Q_{s1}$ are formed so as to be regarded as constituting self-alignment relative to the gate region 42. On the other hand, the source region 56 and the drain region 58 of the IG(MOS) FET $Q_{n2}$ are also formed as self-aligned regions relative to the channel stopper region 43. As stated above, because there can be used the steps which can be regarded as the self-alignment technique, it is possible to minimize the stray capacitance. This makes it possible to design the whole circuitry capable of increasing the operation speed as well as the packing density. The specimen after the Step (e) is shown in its sectional view in FIG. 5.

Step (f)

Figure 6:
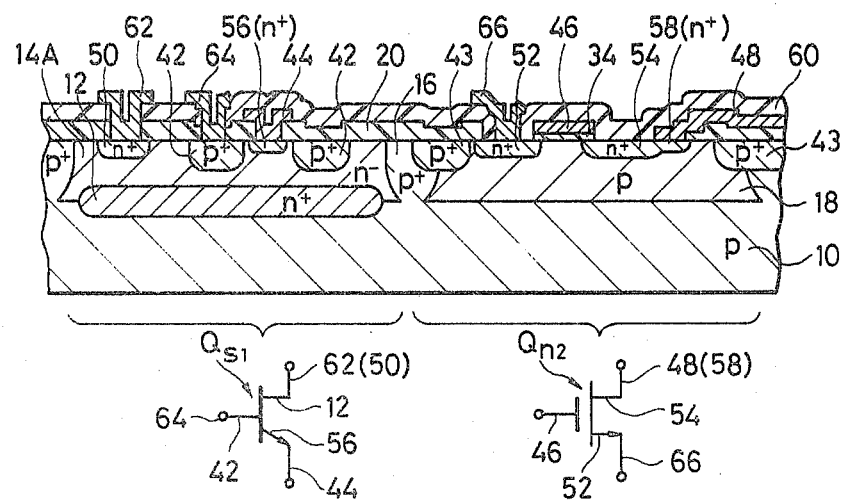

Next, by relying on the CVD method, there is formed, on the entire surface of the substrate, a protective film 60 consisting of, for example, a silicon oxide. After the formation of a window for the purpose of contact, an electrode-wiring metal such as aluminum is deposited thereon by relying on, for example, the vacuum deposition technique through an appropriate masking pattern to form, for example, a drain electrode layer 62 and a gate electrode layer 64 of the n-channel junction SIT $Q_{s1}$ and a source electrode layer 66 of the n-channel IG(MOS) FET $Q_{n2}$. With this, a series of steps for integration completes. A sectional view of the resulting specimen is shown in FIG. 6. Reference numerals corresponding to the respective regions of the transistors $Q_{s1}$ and $Q_{n2}$ are affixed below FIG. 6.

Description has been made above with respect to the method of integration of an SIT and IG(MOS) FET within a same substrate so as to be capable of providing a high-speed operation and a high packing density, as illustrated in the sequential order of the fabricating steps.

According to the manufacturing method of the present invention, an SIT and an IG(MOS) FET can be formed by the steps mentioned above, of which many of the steps are in common. Thus, the number of manufacturing steps as a whole will not increase substantially as compared with the number in the instance wherein either one single kind of transistor is integrated. For this reason, it is possible to materialize, at relatively low cost, an integrated circuit for high-speed operation and high packing density. Also, the IG(MOS) FET can formed so as to be of the self-alignment type and at the same time the SIT also can be formed so as to be of the self-alignment type. As a result, the electric characteristics as well as the packing density can be all the more improved. Furthermore, even in case it is intended to effect a deep diffusion of either the source region or the drain region of the IG(MOS) FET, there arises no impairment of the characteristics of the SIT, since the source region or the drain region of this SIT is formed by a shallow diffusion via a semiconductor body such as polycrystalline silicon. Thus, there is another advantage that there is a large freedom for the designing of the IG(MOS) FET.

Description has been made above, as the first embodiment of the present invention, of the method of integration of an SIT and an IG(MOS) FET on a same substrate so as to be suitable for high-speed operation and with high packing density.

Description will hereunder be made of a method of making an IC for providing a logic circuit using, in a similar manner as that for the first embodiment, a bipolar transistor, a junction SIT and complementary IG-FETs (so-called C-MOS FETs), as a second embodiment of the present invention.

Second Embodiment

FIGS. 7 through 11 show, in the sequential order of the manufacturing steps involved, an example of the steps for making an integrated circuit for use as a logic circuit by integrating, on a same semiconductor substrate, a bipolar transistor $Q_{b1}$, a SIT $Q_{s2}$ and complementary IG(MOS) FETs $Q_{n3}$ and $Q_{p4}$ according to the present invention. As in the first embodiment, description of the present invention will be made with reference to the corresponding figures. Those complementary IG-FETs $Q_{n3}$ and $Q_{p4}$ which are to be integrated according to the second embodiment are called C-MOS FETs and have the features represented by low power dissipation and high-speed operation.

Step (a)

A p type silicon is used as a semiconductor substrate 10. By relying on the known method, an n+ type buried layer 12 is selectively diffused in one surface of the substrate 10 at a required site by, for example, a selective diffusion technique. An epitaxial layer 14 is grown on top of said n+ type buried layer 12 by relying on the vapor epitaxial growth method to a required depth and to have a required impurity concentration.

In the first embodiment, the n+ type buried layer 12 is provided to serve as a drain region of the SIT. However, in the second embodiment, the n+ type buried layer 12 serves conversely as a source region of the SIT $Q_{s2}$. Moreover, this n+ type buried layer 12 will be a common region serving concurrently as a base region having the effect of reducing the base-lead resistance of a lateral bipolar transistor $Q_{b1}$. Then, on the surface of the n⁻ type epitaxial layer 14 is formed a silicon oxide film by relying on an ordinary method such as thermal oxidation technique.

At required sites of the silicon oxide film are selectively formed windows by relying on the photolithographic technique. These windows comprise two kinds of windows which are used for different purposes. Through one of the windows which have been formed at required sites is implanted, into the n⁻ type epitaxial layer 14, a p type impurity by relying on the ion-implantation technique. The amount or concentration of the implanted impurity is set so as to render the required region to a p type and also to have a required impurity concentration. Through the other window which has been formed at a different site is selectively diffused a p type impurity to form a p+ type isolation region 16 extending to reach the substrate 10. Design is set so as to form a p type well region 18 reaching the substrate 10 due to redistribution of the distributed impurity which has been already implanted in the n⁻ type layer 14, by the thermal treatment conducted at the time of said diffusion. As a result, the n⁻ type layer 14 is divided into a plurality of (in this case, two) island-like n⁻ type regions 14A and 14B which are electrically isolated from each other by a p+ type isolation region 16 as shown in FIG. 7. Furthermore, a portion of the n⁻ type region 14B is converted to a p type well region 18, although in the first embodiment the entire n type region 14B is converted to a p type well region.

Description has been made above of the formation of the p type well region 18 by ion-implantation and by subsequent thermal annealing. It should be noted here that this p type well region 18 may be formed by a selective diffusion of a p type impurity. In such instance, if a p type well region 18 is formed at the same time with the formation of the p+ type isolation region 16, the process will be simplified more.

The n⁻ type region 14A is intended for the formation of a lateral bipolar transistor $Q_{b1}$ and an SIT $Q_{s2}$. In the p type well region 18 is formed an n-channel IG(MOS) FET $Q_{n3}$, and in that region of the n⁻ type region 14B other than the p type well region 18 will be formed a p-channel IG(MOS) FET $Q_{p4}$. The specimen after the abovesaid step is shown in its section in FIG. 7. It should be understood that no silicon oxide film is illustrated therein.

Step (b)

Next, the specimen having experienced the foregoing step is subjected to, for example, a thermal oxidation process for forming, again, a silicon oxide film throughout the entire surface thereof. Thereafter, a window is formed at a required site of the surface by relying on the photolithographic technique, and a p type impurity such as Boron is selectively diffused through the window. As a result of said selective diffusion process, there are formed, in the n⁻ type region 14A, a p+ type emitter region 41 of the lateral bipolar transistor $Q_{b1}$ and a p+ type gate region 42 of the SIT $Q_{s2}$. This p+ type gate region 42 is a common region which concurrently serves as a collector region of the lateral bipolar transistor $Q_{b1}$. At the same time therewith, there are formed in the n⁻ type region 14B, a p+ type channel stopper region 43 and a p+ type drain region 45 and a p+ type source region 47 of the p-channel IG(MOS) FET $Q_{p4}$, respectively.

Thereafter, by relying on an ordinary photolithographic technique, there are formed, in the silicon oxide film 20, a window H₁ for making a base contact of the lateral bipolar transistor $Q_{b1}$ and also a source contact of the SIT $Q_{s2}$, a window H₂ for making a drain contact of the SIT $Q_{s2}$, a window H₃ for a portion which will serve as an active area of the IG(MOS) FET $Q_{n3}$, and a window H₄ for a gate region of the p-channel IG(MOS) FET $Q_{p4}$. After the formation of these four windows, there are formed thin oxide films 32, 30, 34 and 37 in the windows H₁, H₂, H₃ and H₄, respectively, by thermal oxidation which is conducted for a short length of time. This oxidation process is intended mainly to form oxide films 34 and 37 having required thicknesses which will serve as insulated gates of the IG(MOS) FETs $Q_{n3}$ and $Q_{p4}$, respectively. Therefore, the windows H₁ and H₂ may be masked with such films as silicon nitride Si₃N₄ films to avoid the formation of silicon oxide films therein. The specimen after the foregoing step is shown in its section in FIG. 8.

Step (c)

Those portions of the silicon oxide film provided on the island-like region 14A which are masked to form the FETs $Q_{n3}$ and $q_{p4}$ are then rinsed with a chemical etchant, to remove the thin silicon oxide films 32 and 30 to revive the aforesaid windows H₁ and H₂ to reveal the n⁻ type layers. It should be understood here that, in case it is not intended to form silicon oxide films 32 and 30 in the windows H₁ and H₂ by means of the aforesaid masking, these windows H₁ and H₂ can be revealed only by the removal of the mask. Here, it will be noted that by the insertion of an oxidation process between the two masking steps, it is possible to prevent the occurrence of rejectable specimen due to the masking defect of the masking process and due to dust and so forth.

Thereafter, a polycrystalline silicon is deposited on the entire surface of the substrate by, for example, the CVD technique, and then this polycrystalline silicon film is subjected to a photolithographic treatment to form polycrystalline layers 44, 51, 46 and 49. The polycrystalline silicon layer 44 is to serve as a common contact for the base region of the lateral bipolar transistor $Q_{b1}$ and for the source region of the SIT $Q_{s2}$. The polycrystalline silicon layer 51 is to serve as a drain contact of the SIT $Q_{s2}$. The polycrystalline silicon layer 46 is to serve as a gate electrode of the n-channel IG(MOS) FET $Q_{n3}$. The polycrystalline silicon layer 49 is to serve as a gate electrode of the p-channel IG(MOS) FET $Q_{p4}$. After the formation of these polycrystalline silicon layers, they are rinsed with a chemical etchant for etching the silicon oxide to perform selective etching by the use of the polycrystalline silicon layer 46 as a mask. However, the silicon oxide film 34 has a thickness smaller than the thicknesses of the silicon oxide films provided on the other portions, so that there are formed windows $H_S$ and $H_D$ for the diffusion of the source region and the drain region. At this stage, the oxide etching process is suspended. A sectional view of the specimen having experienced the foregoing step is shown in FIG. 9.

Step (d)

Then, by a selective diffusion of an n type impurity such as Phosphorus using the polycrystalline silicon layer 46 and the silicon oxide film 20 as masks, there are formed, in the well region 18, an n+ type source region 48 and an n+ type drain region 50 of the n-channel IG(MOS) FET $Q_{n3}$ in such manner as may be regarded as self-alignment relative to the polycrystalline silicon layer 46. During this diffusion process, the polycrystalline silicon layer 46 is rendered to have a low resistivity, and concurrently therewith an n type impurity such as Phosphorus is doped in the polycrystalline layers 44, 51 and 49, to render these layers to have low resistivities. Also, arrangement may be made during this process, so that the n type impurity passes through the polycrystalline layers 44 and 51 to be diffused also to the surface of the island-like region 14A, so that there is formed a semiconductor region 56 for ohmic contact electrode for an n+ type base region of the lateral bipolar transistor $Q_{b1}$, and also for a source region of the SIT $Q_{s3}$, and also there is formed an n+ type drain region 50 of the SIT $Q_{s2}$. In such instance, needless to say, both the n+ type regions 50 and 56 will be formed shallower than the n+ type regions 52 and 54. Thereafter, by relying on the CVD method, there is formed, on the entire surface of the substrate, a protective film 60 consisting of, for example, a silicon oxide. A sectional view of the resulting specimen is shown in FIG. 10.

Step (e)

Next, after forming windows for ohmic contacts by relying on ordinary photolithographic technique, and using a predesigned masking pattern, an electrode-wiring metal such as aluminum is deposited thereon by relying on, for example, vacuum deposition, and thus there are formed an emitter electrode layer 61 of the lateral bipolar transistor $Q_{b1}$, a drain electrode layer 63 of the SIT $Q_{s2}$, a source electrode layer 65 of the n-channel IG(MOS) FET $Q_{n3}$, a wiring layer 67 for interconnection of the respective drain regions of the n− and p-channel IG(MOS) FETs $Q_{n3}$ and $Q_{n4}$, and a source electrode layer 69 of the p-channel IG(MOS) FET $Q_{p4}$. With this, the integration process completes. A sectional view of the resulting specimen is shown in FIG. 11.

In the embodiments shown in for example FIGS. 8 and 9 for clarity's sake, it should be understood that a left-side part of the channel stopper 43 is provided by the p+ type isolation region 16. It should be understood also that FIG. 1 represents an instance wherein the channel stopper 43 is formed in a ring shape. A part of the channel stopper may be formed by the isolation layer also in the embodiment of FIG. 1.

As a result of the abovesaid series of steps, there is formed, on the substrate 10, an integrated circuit having such circuit arrangement as shown below FIG. 11.

As described above, according to the present invention, there are formed an SIT, an IG(MOS) FET and complementary IG(MOS) FETs with many of the manufacturing steps being used in common. Thus, the total number of manufacturing steps does not show a substantial increase as compared with the integration of any single transistor. For this reason, it is possible to materialize, at relatively low cost, an integrated circuit having a high-speed operability and a high packing density. Also, one IG(MOS) FET among the IG(MOS) FET and the complementary IG(MOS) FETs is formed to have a self-alignment fashion using the semiconductor gate layer serving as a mask, and the SIT also can be formed as being of a self-alignment type. Thus, it is possible to further enhance the electrical characteristic and packing density. Furthermore, even in case there is the necessity to deeply diffuse either the source region or the drain region of the IG(MOS) FET having a conductivity type same as that of the SIT, the feature of the SIT is not impaired at all since the source region or the drain region of the SIT can be formed by a shallow diffusion via a semiconductor body such as polycrystalline silicon. Thus, there is another advantage allowing an enhanced freedom of design.

It should be understood that the present invention is not limited to such ICs having those circuit arrangements as illustrated hereinabove with respect to the embodiments. For example, the source region and the drain region of the SIT may be inverted, or the conductivity types of the respective regions of the constituent transistors may be inverted of what are shown, needless to say. Also, the electrical isolation may be realized by relying on the diffusion of gates. In case there is the need for the control of the threshold voltage of the IG(MOS) FET, such control may be made by controlling ion-implantation. Furthermore, the IG(MOS) FET may be formed as a still finer device, i.e. an IG-SIT which may be termed an extremely short channel transistor. It should be understood here that in case the present invention is applied to the IIL circuit, the upper or principal surface will be used as a drain region. In ordinary application, the principal surface is used as a source region. In the instance of the SIT which is employed in the embodiments described herein, either one of the source region and the drain region has been formed prior to the other one of these regions.

In the second embodiment, the drain region of the junction SIT is arranged so as to contact the gate region. Ideally, however, the drain region desirably is separated from the gate region as in the first embodiment. However, in the actual manufacture, the drain region having such dimension as contacting the gate region is easier to make.

What is claimed is:

1. A method of making a semiconductor integrated circuit including a static induction transistor and an insulated-gate type field effect transistor both having an identical conductivity type of their channels, comprising:

(a) a step of preparing a semiconductor substrate having a principal surface containing therein an island-like semiconductor region having a first conductivity type and a semiconductor well region having a second conductivity type opposite to said first conductivity type; and (b) a step of forming, in said semiconductor well region, first a channel stopper semiconductor region and thereafter forming an active semiconductor area of said insulated-gate type field effect transistor, and of concurrently forming, above said island-like semiconductor region in the same processes of forming said channel stopper semiconductor region and said active semiconductor area respectively, first a semiconductor gate region and thereafter either a semiconductor source or drain region of said static induction transistor.

2. A method of making a semiconductor integrated circuit including a static induction transistor and an insulated-gate type field effect transistor both having an identical conductivity type of their channels, comprising:

(a) a step of preparing a semiconductor substrate having a principal surface containing therein an island-like semiconductor region having a first conductivity type and a semiconductor well region having a second conductivity type opposite to said first conductivity type;

(b) a step of forming, in said semiconductor well region, a semiconductor gate layer of said insulated-gate type field effect transistor, and of concurrently forming, in said island-like semiconductor region in the same process of forming said semiconductor gater layer, a semiconductor contact layer for either a source region or a drain region of said static induction transistor; and (c) a step of forming a source and drain of said insulated-gate type field effect transistor by relying on a selective impurity doping technique using said semiconductor gate layer as a mask therefor, and of concurrently reducing a resistivity of said semiconductor contact layer and forming said source or drain region of said static induction transistor by doping an impurity into said semiconductor substrate via said semiconductor contact layer in the same process for forming the source region or the drain region.

3. A method of making a semiconductor integrated circuit including a static induction transistor and an insulated-gate type field effect transistor both having an identical conductivity type of their channels, comprising:

(a) a step of preparing a semiconductor substrate having a principal surface covered with an insulated film and containing therein an island-like semiconductor region having a first conductivity type and a semiconductor well region having a second conductivity type opposite to said first conductivity type;

(b) a step of forming, in said insulated film on said island-like region by relying on a photolithographic technique, a window for forming a semiconductor gate region of said static induction transistor and a window for forming a contact for a source region or a drain region of said static induction transistor, and of concurrently forming, in said insulated film on said semiconductor well region, in this same photolithographic technique, a window for positioning an active semiconductor area and a window for forming a channel stopper semiconductor region of said insulated-gate type field effect transistor;

(c) a step of forming, in a state that said window for said contact and said window for positioning said active semiconductor area are masked, a semiconductor gate region of said static induction transistor and a channel stopper semiconductor region of said insulated-gate type field effect transistor by selectively doping in said island-like semiconductor region and in said semiconductor well region through said window intended for forming said gate region and through said window for forming said channel stopper semiconductor region, respectively;

(d) a step of forming, in said active semiconductor area positioning window, a semiconductor gate layer of said insulated-gate type field effect transistor, and of concurrently forming, in said contact-forming window, a semiconductor contact layer for either said source region or said drain region of said static induction transistor in the same process of forming said semiconductor gate layer; and (e) a step of forming, by doping an impurity using said semiconductor gate layer as a mask, either a source region or a drain region of said insulated-gate type field effect transistor, and of concurrently reducing a resistivity of said semiconductor contact layer by doping an impurity in said semiconductor contact layer in this same process of forming said source region or said drain region.

4. A method of making a semiconductor integrated circuit including a static induction transistor and a first and a second insulated-gate type field effect transistor, the latter two transistors having mutually different conductivity types of their channels, comprising:

(a) a step of preparing a semiconductor substrate having a principal surface containing therein a first and a second island-like region both having a first conductivity type and containing locally in said second island-like region a semiconductor well region having a second conductivity type opposite to said first conductivity type;

(b) a step of forming, in that portion of said second island-like semiconductor region other than the portion where said semiconductor well region is formed, either a source region or a drain region of said first insulated-gate type field effect transistor, and of concurrently forming, in said first island-like semiconductor region by selectively doping an impurity in this same process of forming said source region or said drain region, a semiconductor gate region of said static induction transistor;

(c) a step of forming, in said semiconductor well region, a semiconductor gate layer of said second insulated-gate type field effect transistor, and of concurrently forming, in the same process of forming said semiconductor gate region, a semiconductor contact layer for either a source region or a drain region of said static induction transistor and also a semiconductor gate layer of said first insulated-gate type field effect transistor; and (d) a step of forming, by using said semiconductor gate layer of said second insulated-gate type field effect transistor as a mask and by selectively doping an impurity, either a source region or a drain region of said second insulated-gate type field effect transistor, and of concurrently reducing resistivity of said semiconductor gate layer and of said semiconductor contact layer of said first insulated-gate type field effect transistor by doping an impurity in these latter two layers in the same process of forming said source region or said drain region.

5. In a process for simultaneously forming a static induction transistor (SIT) and an insulated gate field effect transistor (IGFET) in a semiconductor body covered by an insulating layer, the steps of:

concurrently forming windows in said insulating layer to define (a) an IGFET active area, (b) the location of a source or drain contact of said SIT, and (c) the location of a gate region of said SIT, providing a thin insulating layer within said window which defines said IGFET active area, providing polysilicon (1) onto a portion of said thin insulating layer to form the gate of said IGFET active area, and (2) into said SIT source or drain contact locating window, and depositing a dopant into openings provided on either side of said polysilicon gate to form the source and drain regions of said IGFET, said regions being self-aligned with respect to said polysilicon gate, and concurrently providing dopant into said semiconductor body through said polysilicon in said source or drain contact locating window to form an SIT source or drain region in said body, said SIT source or drain region being shallower than said IGFET source and drain regions, and being self-aligned with respect to the gate of said SIT by virtue of the concurrent forming of the windows defining the locations of said gate region and said source or drain region of said SIT.

* * * * *